United States Patent
Ng et al.

(10) Patent No.: US 9,184,149 B2
(45) Date of Patent: Nov. 10, 2015

(54) SEMICONDUCTOR DEVICE WITH AN INTERLOCKING WIRE BOND

(71) Applicant: Avago Technologes General IP (Singapore) Pte. Ltd., Singapore (SG)

(72) Inventors: Keat Chuan Ng, Penang (MY); Kiam Soon Ong, Penang (MY); Kheng Leng Tan, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/179,397

(22) Filed: Feb. 12, 2014

(65) Prior Publication Data
US 2015/0228608 A1  Aug. 13, 2015

(51) Int. Cl.
*H01L 23/495* (2006.01)
*H01L 23/00* (2006.01)
*H01L 33/62* (2010.01)

(52) U.S. Cl.
CPC ............... *H01L 24/48* (2013.01); *H01L 33/62* (2013.01); *H01L 2224/48105* (2013.01)

(58) Field of Classification Search
USPC ............... 257/98, 99, 100, 670, 676, 783, 257/E23.039, E23.04
See application file for complete search history.

(56) References Cited

U.S. PATENT DOCUMENTS

| 5,640,762 A * | 6/1997 | Farnworth et al. ............... 29/833 |
| 2005/0173793 A1* | 8/2005 | Rohrmoser et al. ........... 257/724 |
| 2008/0054288 A1* | 3/2008 | Harrah et al. .................... 257/99 |

FOREIGN PATENT DOCUMENTS

| CN | 201204212 | 3/2009 | |
| JP | 5-190891 | * 7/1993 | .............. H01L 31/12 |

OTHER PUBLICATIONS

Chan, Lewis , "An Innovative Leadframe Surface Treatment to Improve MSL", Lewis Chan. 2011. Downloaded online website: <www.future-fab.com/documents.asp?d_ID=4878>. pp. 1-5 2011.
Kristiansen, Helge , "Adhesives in Microelectronics and MEMS Applications", Downloaded online <http://tid.uio.no/kurs/fys4260/Adhesives_in_electronics.pdf>. Publication Date unavailable. 100 pages.
Lin, Yuan-Chang , "LED and Optical Device Packaging and Materials", Downloaded online website: <www.cnledw.com/inter/upload/20091015131112940609.pdf> Chapter 18. 2009. pp. 629-680.

* cited by examiner

*Primary Examiner* — Jasmine Clark

(57) ABSTRACT

In one embodiment, a semiconductor device having a die attach pad, an interlocking wire bond, a semiconductor die and an adhesive material is disclosed. The adhesive material may be configured to adjoin the semiconductor die and the die attach pad. A portion of the interlocking wire bond may be submerged within the adhesive material. In another embodiment, a device having a semiconductor die, a die attach glue and a die attach pad is disclosed. The device may comprise an interlock bonding structure submerged within the adhesive material. In yet another embodiment, a light-emitting device comprising an interlock structure is disclosed.

20 Claims, 11 Drawing Sheets

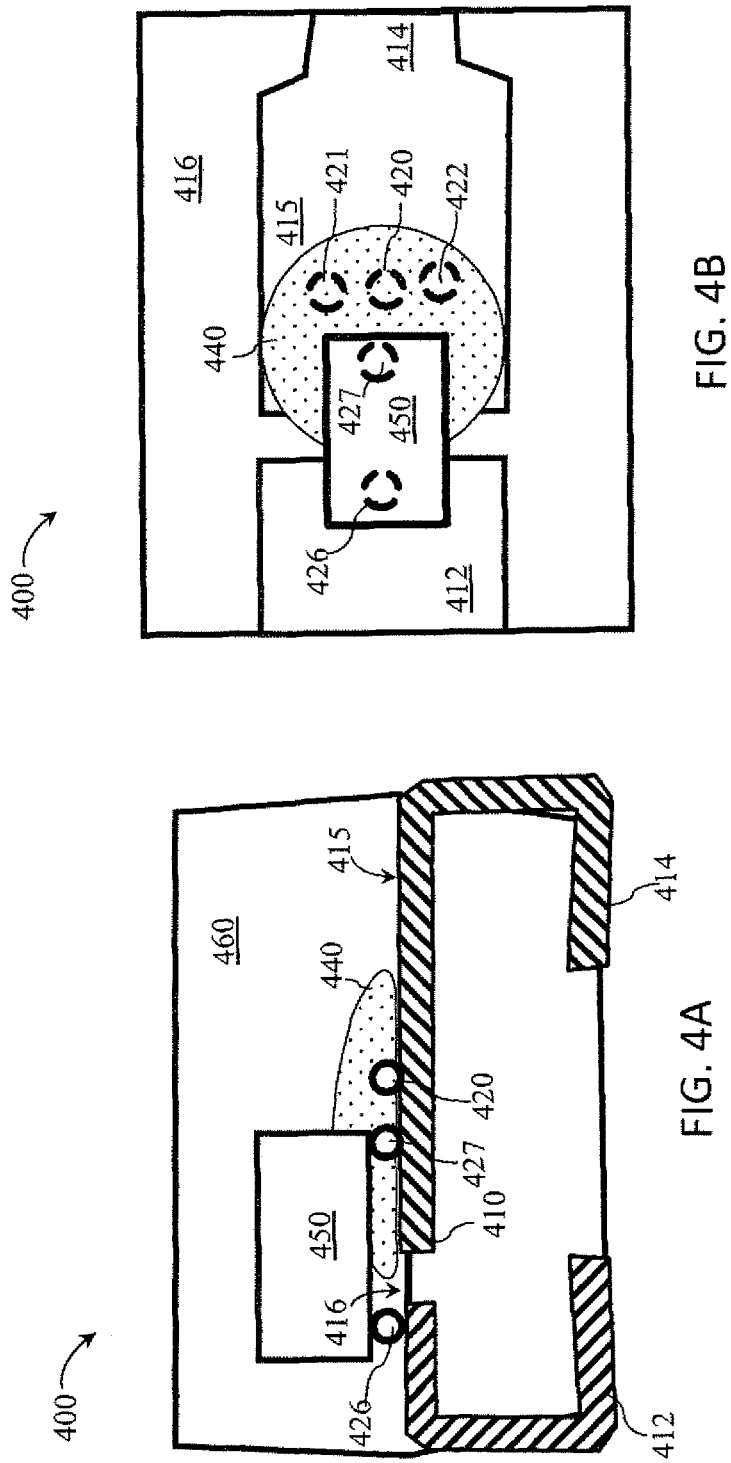

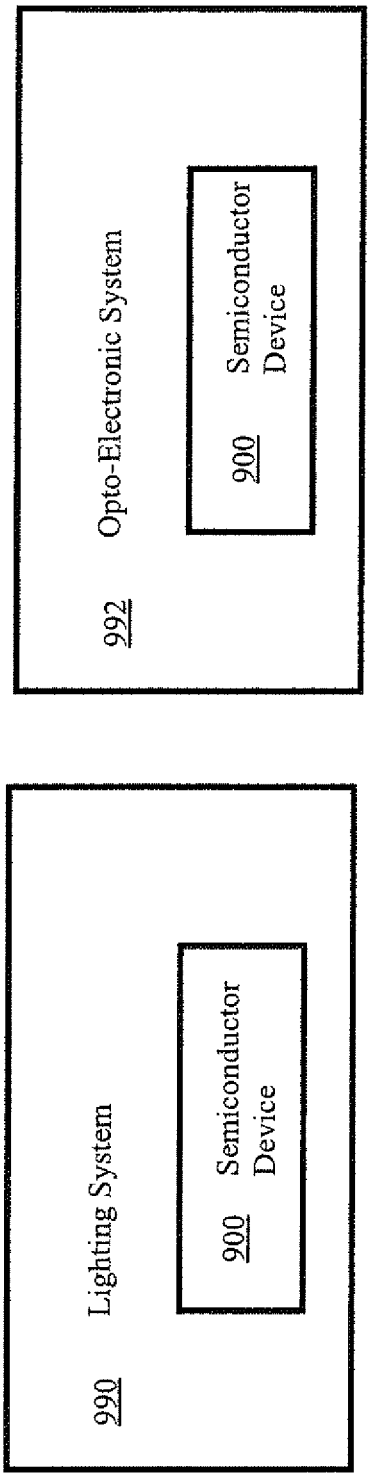

1022 — ATTACHING THE FIRST AND SECOND ENDS OF THE INTERLOCKING WIRE BOND ON THE DIE ATTACH PAD

FIG. 10B

1032 — SURROUNDING THE FIRST AND SECOND ENDS OF THE INTERLOCKING WIRE BOND WITH THE DIE ATTACH GLUE

FIG. 10C

1034 — SURROUNDING A PORTION OF THE INTERLOCKING WIRE BOND BETWEEN THE FIRST AND SECOND ENDS OF THE INTERLOCKING WIRE BOND WITH THE DIE ATTACH GLUE SUCH THAT THE FIRST AND SECOND ENDS OF THE INTERLOCKING WIRE ARE EXPOSED OUTSIDE THE DIE ATTACH GLUE

FIG. 10D

SEMICONDUCTOR DEVICE WITH AN INTERLOCKING WIRE BOND

BACKGROUND

Semiconductor devices may be implemented using various packaging technologies such as a plastic leaded chip carrier (herein after PLCC) package, a ball grid array package (herein after BGA), a pin grid array package (herein after PGA), a quad flat pack (herein after QFP), a printed circuit board (herein after PCB) package and so on. Certain packages, for example PLCC packages in light-emitting devices, may comprise a lead frame over a molded polymer material such as Polyphthalamide (herein after PPA), Polyamide or Epoxy resin encapsulant like MG 97. For surface mount type, leads extending from the lead frame may be bent so that the semiconductor devices can be soldered on a substrate without through-holes. One of the most popular semiconductor devices may be opto-electronic device. One characteristic of opto-electronic devices may be the feature of having a light source die or a radiation source die. Example of opto-electronic devices may be opto-couplers, light emitting devices, proximity sensors, encoders and other similar devices having a radiation source.

One of the reasons why many semiconductor devices fail reliability test may be due to delamination of encapsulant or epoxy material surrounding a semiconductor die. After going through hundreds or thousands of temperature cycles, some semiconductor dies may be lifted-up from the die attach pad, causing an open circuit. One explanation of the failure may be due to delamination of the epoxy material. Further, the failure rate may be higher for industrial or automotive use semiconductor devices, which may be required to operate at wide range of temperatures. Additionally, the failure rate for opto-electronic devices may be relatively higher due to the use of substantially transparent epoxy as encapsulant body. Most epoxy used in opto-electronic devices may be susceptible to delamination especially. The result may be that the entire transparent encapsulant body, as well as the light source die may be lifted up from the die attach pad more easily, compared to non-optics types of devices.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings may be for illustrative purpose to assist understanding and may not be drawn per actual scale. For example, the interlocking wire bond of each embodiment may be drawn relatively larger than actual scale to enhance understanding.

FIG. 4A illustrates a cross-sectional view of a semiconductor device having an interlocking bond ball;

FIG. 4B illustrates a top view of the semiconductor device shown in FIG. 4A;

FIG. 9A illustrates a block diagram of a lighting system;

FIG. 9B illustrates a block diagram of an opto-electronic system;

FIGS. 10B-10D illustrate various alternative steps for the method shown in FIG. 10A.

DETAILED DESCRIPTION

Figure 1:
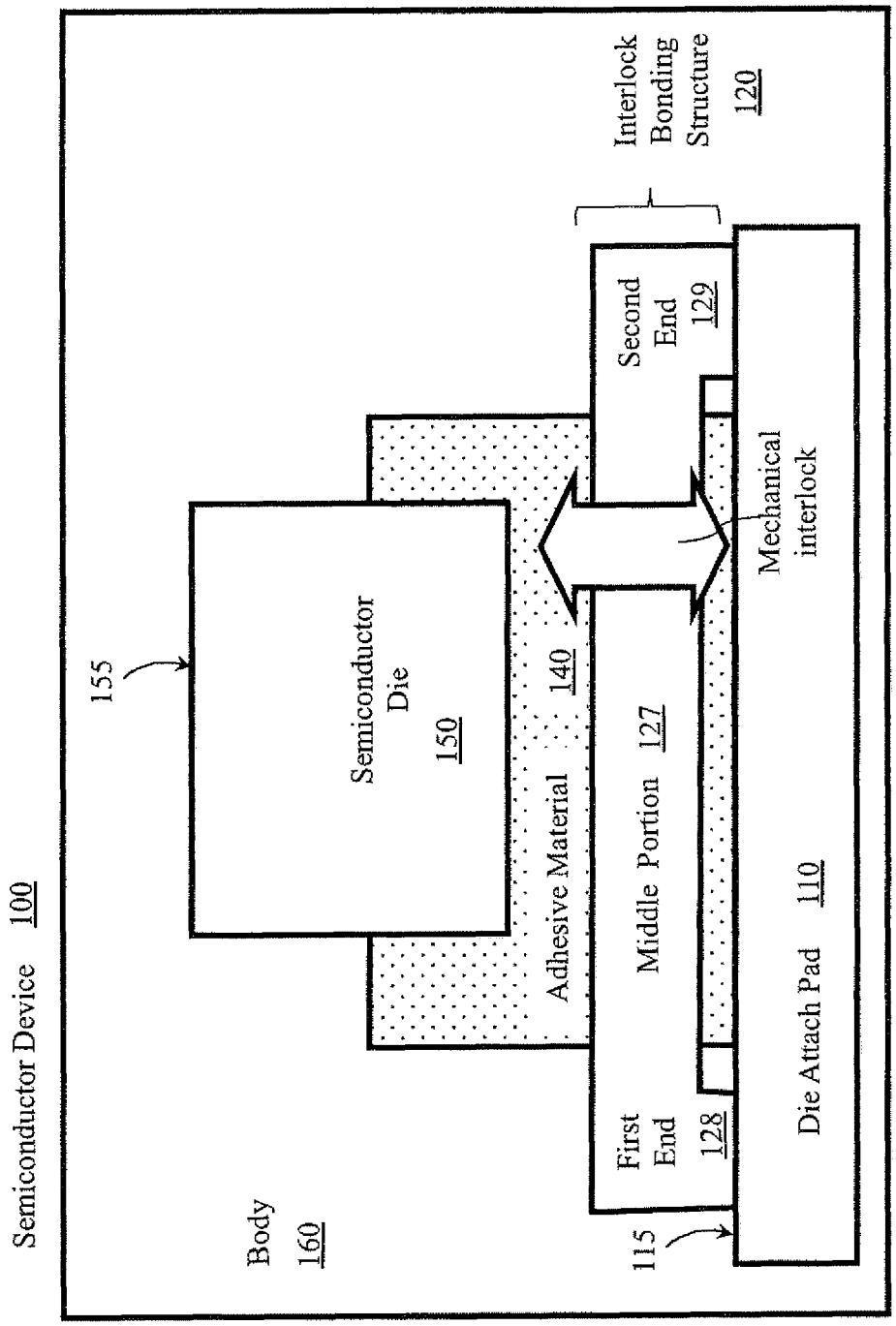
FIG. 1 shows an illustrative block diagram of a semiconductor device having an interlocking wire bond.

FIG. 1 shows an illustrative block diagram of a semiconductor device 100. The semiconductor device 100 may be an electronic device. Examples of a semiconductor device may be an encoder, an application specific integrated circuit (also referred as "ASIC"), camera modules, opto-electronic devices such as opto-couplers, encoders, proximity sensors and any other similar devices having a die in a packaging. The semiconductor device 100 may comprise a die attach pad 110, an interlock bonding structure 120, an adhesive material 140, a semiconductor die 150 and a body 160. The die attach pad 110 may comprise a major surface 115 for receiving the semiconductor die 150. The die attach pad 110 may be portion of a lead frame (not shown) encapsulated at least partially within the body 160. "Lead frame" (not shown) as used herein in reference to the semiconductor devices 100, refers to a structure capable of electrically connecting the semiconductor die 150 to an external power source or an external circuit (not shown). In PLCC packages, the lead frames may comprise a plurality of leads. The semiconductor device 100 in a PLCC package may comprise a plurality of leads encapsulated partially within a plastic body 160. One of the leads (not shown) may comprise the die attach pad 110 characterized by a widened portion to receive the semiconductor die 150.

In the embodiment shown in FIG. 1, the die attach pad 110 may be made of electrically and thermally conductive material, such as steel, copper, metal or a metal alloy, a metal compound or other similar materials. The die attach pad 110 may be formed using any stamping, cutting, etching or other similar process. The semiconductor die 150 may be attached on the die attach pad 110 via the adhesive material 140. The adhesive material 140 may be configured to adjoin the semiconductor die 150 and the die attach pad 110. For example, the adhesive material 140 may be applied to the major surface 115 of the die attach pad 110 first before the semiconductor die 150 is mounted to the die attach pad 110. The adhesive material 140 may be referred as "die attach glue" or "DA glue". The adhesive material 140 may comprise epoxy, silicone or other similar material that may be adhesive to adjoin the semiconductor die 150 to the die attach pad 110. The adhesive material 140 may comprise electrically conductive material. The adhesive material 140 may be in a substantially liquid form during the die attach process but may be subsequently cured into solid form. The adhesive material 140 may be opaque but in another embodiment, the adhesive material 140 may be substantially transparent.

The interlock bonding structure 120 may be a wire bond, a bond ball or any other structure configured to electrically connect at least one portion of the semiconductor die 150 to an external circuit or an external power source. However, the interlock bonding structure 120 may be at least differentiated from a wire bond in that the interlock bonding structure 120 may not be physically coupled to the semiconductor die 150 for an electrical connection. Instead, the interlock bonding structure 120 may be configured to establish a mechanical interlock. For example, in the embodiment shown in FIG. 1, the interlock bonding structure 120 may be distanced away from the semiconductor die 150. Specifically, the interlock bonding structure 120 may be configured to provide a mechanical interlock with the adhesive material 140. As the interlock bonding structure 120 may be attached to the die attach pad 110 of the lead frame (not shown) or to one of the lead frame directly, the mechanical interlock established through the interlock bonding structure 120 may be configured to provide a mechanical interlock between the adhesive material 140 and the die attach pad 110, or one of the lead frame. The interlock bonding structure 120 implemented using a wire bond may be referred hereinafter as interlocking wire bond 120 whereas the interlock bonding structure 120 implemented using a bond ball may be referred hereinafter as interlocking bond ball 120. However, when one of the interlocking bond ball 120 or the interlocking wire bond 120 is referred, all types of interlock bonding structure 120 should be included into consideration.

The interlock bonding structure 120 may be sandwiched between the semiconductor die 150 and the major surface 115 of the die attach pad 110. Alternatively, the interlock bonding structure 120 may be disposed on the major surface 115 of the die attach pad 110 adjacent to the semiconductor die 150 without being sandwiched in between.

Optionally, the interlock bonding structure 120 may comprise a first end 128 and a second end 129 configured to be attached on either on the major surface 115 of the die attach pad 110 or a portion of a lead (not shown). A middle portion 127 of the interlock bonding structure 120 may engage substantially the adhesive material 140 so as to establish the mechanical interlock between the interlocking boding structure 120 and the adhesive material 140. The arrangement shown in FIG. 1 may improve the interlock between the adhesive material 140 and the die attach pad 110. The adhesion force between the first end 128 and the second end 129 of the interlock bonding structure 120 may be higher than the adhesion force between the adhesive material 140 and the die attach pad 110. With the arrangement shown in FIG. 1, the adhesion force between the adhesive material 140 and the die attach pad 110 may be supplemented by the mechanical interlock between the adhesive material 140 and the interlocking structure 120 in addition to the adhesive force between the die attach pad 110 and the adhesive material 140 directly. As a result, reliability performance may improve.

In one manufacturing process, the interlock bonding structure 120 may be formed first prior to the step of applying the adhesive material 140 to the die attach pad 110. As a result, a thin layer of the adhesive material 140 may be formed between the semiconductor die 150 and the die attach pad 110. The thin layer of the adhesive material 140 sandwiched between the semiconductor die 150 and the interlock bonding structure 120 of the die attach pad 110 may be less than fifty microns. This arrangement may reduce packaging height. Optionally, the semiconductor die 150 may be attached directly to the die attach pad 110 adjacent to the interlock bonding structure 120 in order to reduce packaging height.

The adhesive material 140 may be configured to cover at least partially the interlock bonding structure 120 as shown in FIG. 1. In another embodiment, the adhesive material 140 may cover entirely the interlock bonding structure 120 including the first end 128 and the second end 129 of the interlock bonding structure 120. The adhesive material 140 may be applied to a lower portion of the semiconductor die 150. As illustrated in FIG. 1, the adhesive material 140 may be configured to surround the lower portion of the semiconductor die 150. In one embodiment where the semiconductor die 150 comprises a light source, the adhesive material 140 may be substantially transparent. However, the adhesive material 140 may also be a substantially opaque material. Therefore, having the adhesive material 140 confined to lower portion of the semiconductor die 150 may expose substantial portion of the semiconductor die 150 so as not to substantially block light emission.

In another embodiment where the semiconductor die 150 may comprise a photo-detector on a top surface 155 of the semiconductor die 150, the adhesive material 140 may be distanced away from the top surface 155 of the semiconductor die 150 such that light may be transmitted to the semiconductor die 150 without being blocked by the adhesive material 140. In yet another embodiment where the semiconductor die 150 is a light-emitting die, the adhesive material 140 that may be opaque may be covering less than 20% of the height of the semiconductor die 150 so as not to obstruct the light emission.

Figure 2B:
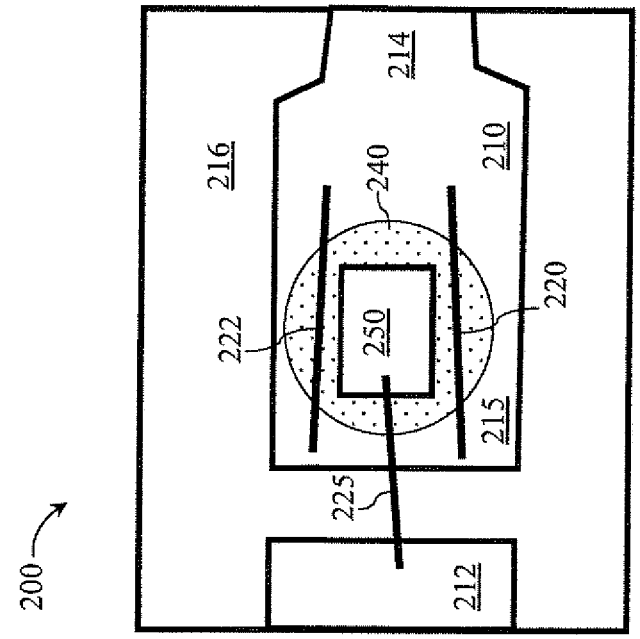
FIG. 2B illustrates a top view of the semiconductor device shown in FIG. 2A.
Figure 2A:
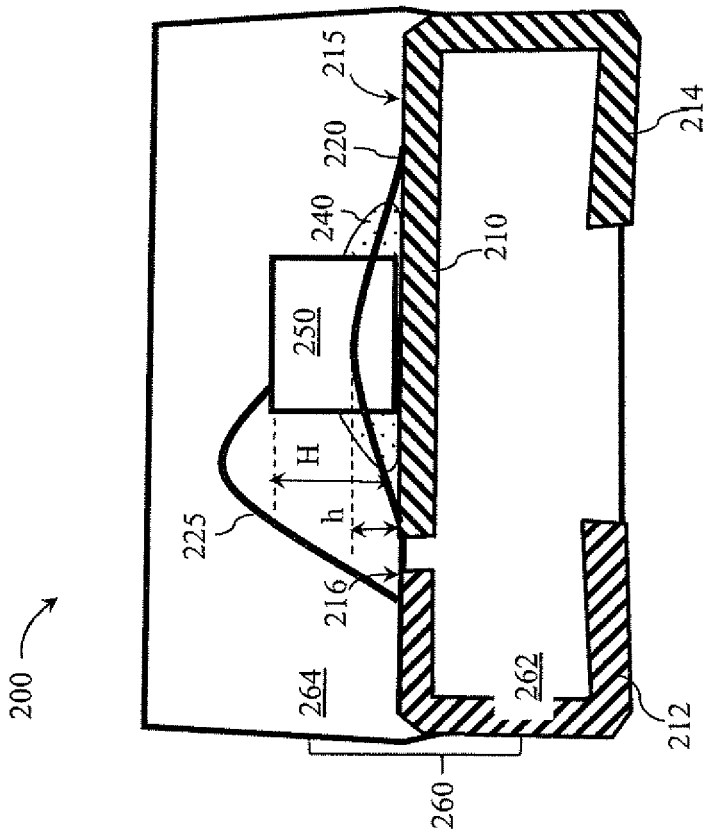
FIG. 2A illustrates a cross-sectional view of a semiconductor device having an interlocking wire bond.

FIG. 2A illustrates a cross-sectional view of a semiconductor device 200. The semiconductor device 200 may comprise a plurality of leads 212, 214, a die attach pad 210, a die attach surface 216, a semiconductor die 250, an interlocking wire bond 220 an additional interlocking wire bond 222 and an encapsulant body 260 having a lower portion 262 and an upper portion 264. Optionally, the semiconductor device 200 may comprise a wire bond 225. A top view of the semiconductor device 200 may be shown in FIG. 2B. The top view of the semiconductor device 200 shown in FIG. 2B may be at a stage prior to formation of the encapsulant body 260 so as to expose the semiconductor die 250 and the interlocking wire bond 220 for illustration purpose.

Referring to FIG. 2A and FIG. 2B, one of the leads 214 may comprise the die attach pad 210 having a major surface 215. The major surface 215 may form a portion of the die attach surface 216. The semiconductor die 250 may be mounted on the major surface 215 of the die attach pad 210. The major surface 215 of the die attach pad 210 may be disposed within a die attach surface 216 of the semiconductor device 200. The die attach surface 216 may be configured to receive the semiconductor die 250. The die attach surface 216 may comprise the major surface 215 and a surface of lower portion 262 of the encapsulant body 260.

The semiconductor die 250 may be mounted on the die attach pad 210 such that a bottom surface of the semiconductor die 250 may engage the die attach pad 210. An adhesive material 240 may be configured to adjoin the semiconductor die 250 and the die attach pad 210. The adhesive material 240 may comprises a die attach glue 240 that is electrically conductive. Generally, the adhesive material 240 may be applied to the die attach pad 210 prior to mounting the semiconductor die 250 on the die attach pad 210. Thus, the adhesive material 240 may be formed between the semiconductor die 250 and the die attach pad 210.

The plurality of leads 212, 214 may be a mean for coupling the semiconductor die 250 to an external circuit or to an external power source (not shown). The semiconductor die 250 may be coupled to the lead 212 through a bond wire 225 in addition to the electrical contact between the lead 214 and the semiconductor die 250. The plurality of leads 212, 214 may be a portion of a lead frame or a portion of conductive traces on a printed circuit board.

The encapsulant body 260 may comprise the lower portion 262 and the upper portion 264 formed using a lower mold and an upper mold respectively. The term "body" 260 as used herein in reference to a component of a semiconductor device 200 may refer to a respective primary structure, which provides structural support for other components of the semiconductor device 200. In FIG. 2A, the encapsulant body 260 may be epoxy, silicone or other encapsulant formed encapsulating or surrounding the plurality of leads 212, 214 and the semiconductor die 250 using an injection molding process or other similar processes. In another embodiment, the body 260 may be a substrate such as a PCB. The encapsulant body 260 may be an integral single piece structure formed using an opaque material such as PPA, polyamide, epoxy resin, plastic and other similar materials. In yet another embodiment where the semiconductor device 200 comprises a light emitting die 250, the upper portion 264 of the encapsulant body 260 may be substantially transparent.

As shown in FIG. 2A, the interlocking wire bond 220 may be disposed on the major surface 215 of the die attach pad 210. The interlocking wire bond 220 may be made from metallic material similar to the wire bond 225. Unlike wire bond 225 that may be attached to a portion of the semiconductor die 250 for electrical connection, the interlocking wire bond 220 may be attached on the die attach pad 210 without establishing electrical connection with the semiconductor die 250. For example, the interlocking wire bond 220 may comprise a first end and a second end attached on the die attach pad 210. Both of the first end and the second end of the interlocking wire bond 220 may be attached on the die attach pad 210 or in contact with one portion of the plurality of leads 212, 214. The wire bond 225 on the other hand may have a least the first end and the second end being attached on the semiconductor die 250. In the embodiment shown in FIG. 2A, the interlocking wire bond 220 may be completely distanced away from the semiconductor die 250. In another embodiment, a center portion of the interlocking wire bond 220 may be configured to engage the semiconductor die 250 while the first end and the second end of the interlocking wire bond 220 may remain distanced away from the semiconductor die 250.

In the embodiment shown in FIG. 2A, a center portion of the interlocking wire bond 220 may be encapsulated within the adhesive material 240. The first end and the second end of the interlocking wire bond 220 may be distanced away from the adhesive material 240. By having the first end and the second end of the interlocking wire bond 220 being disposed outside the adhesive material 240, delamination of the adhesive material 240, if happen, would not assert a force on the first end and the second end of the interlocking wire bond 220. In addition, the interlocking wire bond 220 may be made from metallic material that may be resilient and may be able to absorb the force arises from the delamination.

Referring to FIG. 2A, the semiconductor die 250 may have a height (H) measuring from the major surface 215 of the die attach pad 210. The interlocking wire bond 220 may be disposed below half of the height (H) measuring from the major surface 215 of the die attach pad 210. For example, the interlocking wire bond 220 may have a height (h) measuring from the major surface 215 of the die attach pad 210. The ratio of the height (h) and the height (H) of the semiconductor die 250 may be approximately less than half. In another embodiment, the interlocking wire bond 220 may be disposed below a quarter of the height (H) measuring from the major surface 215 of the die attach pad 210. With this arrangement, the overall size may be compact and may improve reliability result. In addition, if the semiconductor die 250 is a light-emitting die, the arrangement may prevent the interlocking wire bond 220 from blocking light emission. For optical semiconductor dies 250, this arrangement may prevent obstruction of light emission.

The semiconductor device 200 may further comprise an additional interlocking wire bond 222 as shown in a top view of the semiconductor device 200 shown in FIG. 2B. The interlocking wire bond 220, the additional interlocking wire bond 222 and the die attach pad 210 may be electrically interconnected. The additional interlocking wire bond 220 may comprise a first end and a second end that may be distanced away from the adhesive material 240. A shown in FIG. 2B, the first end of the interlocking wire bond 220 and the first end of the additional interlocking wire bond 222 may be attached on the die attach pad 210 side-by-side. Similarly, the second end of the interlocking wire bond 220 and the second end of the additional interlocking wire bond 222 may be attached on the die attach pad 210 side-by-side. As a result, the interlocking wire bond 220 and the additional interlocking wire bond 222 may be arranged substantially in parallel.

The interlocking wire bond 220 and the additional interlocking wire bond 222 may be attached on the die attach pad 210 such that the semiconductor die 250 is surrounded by the first end of the interlocking wire bond 220, the second end of the interlocking wire bond 220, the first end of the additional interlocking wire bond 222 and the second end of the additional interlocking wire bond 222 on the die attach pad 210. Hence, as can be seen in FIG. 2B, the interlocking wire bond 220 and the additional interlocking wire bond 222 may be arranged interposing the semiconductor die 250 on the major surface 215 of the die attach pad 210. This arrangement may further strengthen the mechanical interlock between adhesive material 240 and the die attach pad 210 by using the interlocking wire bond 220 and the additional interlocking wire bond 222.

Figure 3B:
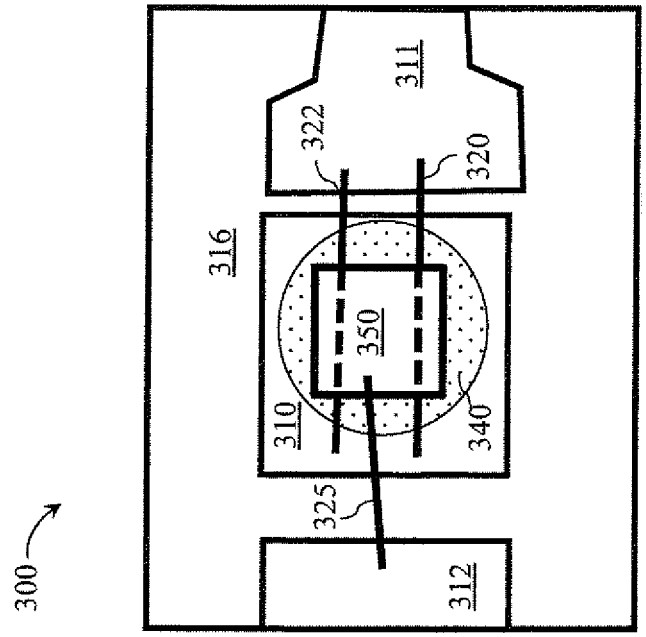
FIG. 3B illustrates a top view of the semiconductor device shown in FIG. 3A.
Figure 3A:
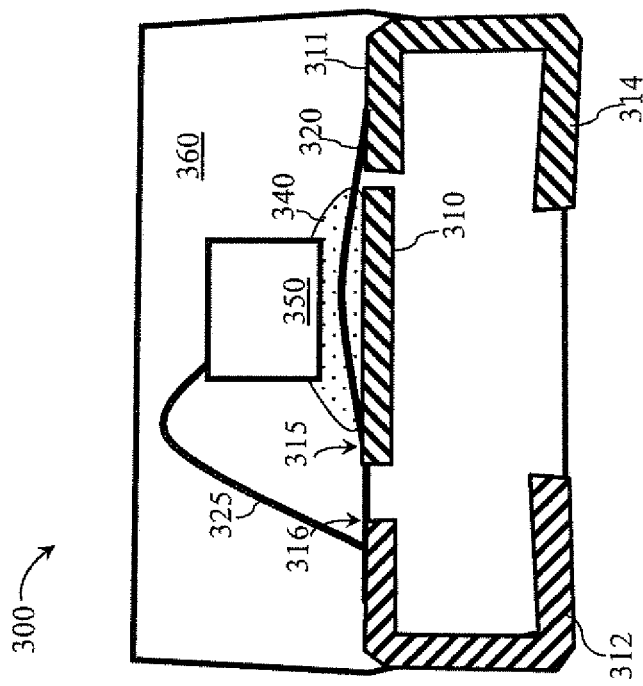
FIG. 3A illustrates a cross-sectional view of an alternative semiconductor device having an interlocking wire bond.

FIG. 3A illustrates a cross-sectional view of a semiconductor device 300. The semiconductor device 300 may comprise a plurality of leads 312, 314, a die attach pad 310, a die attach surface 316, a semiconductor die 350, an interlocking wire bond 320, additional interlocking wire bond 322 and an encapsulant body 360. The semiconductor die 350 may be disposed on a major surface 315 of the die attach pad 310. The major surface 315 of the die attach pad 310 may form a portion of the die attach surface 316. The die attach surface 316 may be a surface of the semiconductor device 300 configured to receive the semiconductor die 350. Optionally, the semiconductor device 300 may further comprise a wire bond 325. FIG. 3B illustrates a top view of the semiconductor device 300 shown in FIG. 3A without the encapsulant body 360 to illustrate inner portions of the semiconductor device 300 which may be otherwise covered by the encapsulant body 360.

The semiconductor device 300 may be substantially similar to the semiconductor device 200 but may differ at least in that at least a center portion of the interlocking wire bond 320 and the additional interlocking wire bond 322 may be sandwiched between the semiconductor die 350 and the die attach pad 310. Specifically, as shown in FIG. 3A and FIG. 3B the semiconductor die 350 and the die attach pad 310 may interpose at least a center portion of the interlocking wire bond 320 and at least a center portion of the additional interlocking wire bond 322. With this arrangement, mini mum area of the die attach pad 310 may be used.

Each of the interlocking wire bond 320 and the additional interlocking wire bond 322 may have a first end attached to the die attach pad 310 respectively. In addition, each of the interlocking wire bond 320 and the additional interlocking wire bond 322 may have a second end attached to an additional wire bond pad 311 of a lead 314. The interlocking wire bond 320 and the additional interlocking wire bond 322 may be configured to electrically connect the die attach pad 310 and the lead 314. This arrangement may impose less stress on the lead 314 as compared to the embodiment shown in FIG. 2A.

FIG. 4A illustrates a cross-sectional view of a semiconductor device 400. The semiconductor device 400 may comprise a plurality of leads 412, 414, a die attach pad 410 formed by a portion of a lead 414, a semiconductor die 450, a die attach surface 416, an interlock bonding structure 420, additional interlock bonding structures 421, 422 and an encapsulant body 460. The semiconductor die 450 may be disposed on a major surface 415 of the die attach pad 410. The major surface 415 of the die attach pad 410 may form a portion of the die attach surface 416. The die attach surface 416 may be a surface of the semiconductor device 400 configured to receive the semiconductor die 450. The plurality of leads 412, 414 may be a portion of a lead frame (not shown). Optionally, the semiconductor device 400 may further comprise a wire bond 325 as shown in FIG. 3A or bond balls 426, 427 to electrically connect the semiconductor die 450 to an external circuit (not shown). FIG. 4B illustrates a top view of the sem iconductor device 400 shown in FIG. 4A without the encapsulant body 460 to illustrate inner portions of the semiconductor device 400 which may be otherwise covered by the encapsulant body 460.

The semiconductor device 400 may be substantially similar to the semiconductor device 200, but may differ at least in that the semiconductor device 400 may comprise an interlock bonding structure 420 that may be completely surrounded by or completely submerged within the adhesive material 440 as shown in FIG. 4A. In the embodiment shown in FIG. 4A, the adhesive material 440 may be a die attach glue 440 whereas the interlock bonding structure 420 may be an interlocking bond ball 420.

The interlocking bond ball 420 and the additional interlocking bond balls 421,422 may be substantially similar to the bond balls 426, 427 for electrically connecting a portion of the semiconductor die 450 to an external circuit (not shown), but may differ at least in that the interlocking bond ball 420 and the additional interlocking bond balls 421,422 may be connected only to a portion of a lead frame, such as the die attach pad 410 as shown in FIG. 4A and FIG. 4B, without having any direct contact with the semiconductor die 450. In other words, the interlocking bond ball 420 and the additional interlocking bond balls 421,422 may be characterized by the feature that the interlocking bond ball 420 and the additional interlocking bond balls 421,422 may be attached on a portion of a lead frame, such as the die attach pad 410.

As shown in FIG. 4A and FIG. 4B, the interlocking bond ball 420 and the additional interlocking bond balls 421,422 may be arranged adjacent to the semiconductor die 450 on the major surface 415 of the die attach pad 410. The semiconductor die 450 may be arranged on the bond balls 426-427. In another embodiment, a center portion of the semiconductor die 450 may be mounted directly on the die attach pad 410 whereas a peripheral portion of the semiconductor die 450 may be mounted on the bond balls 426-427.

Figure 5B:
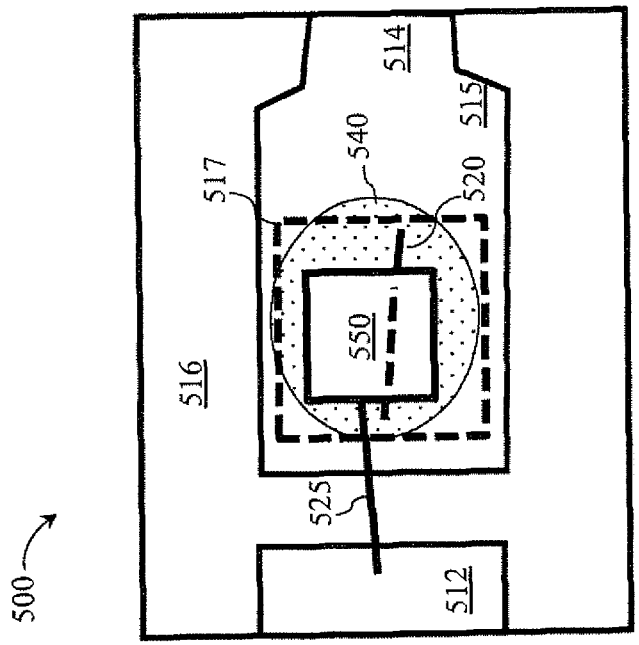
FIG. 5B illustrates a top view of the semiconductor device shown in FIG. 5A.
Figure 5A:
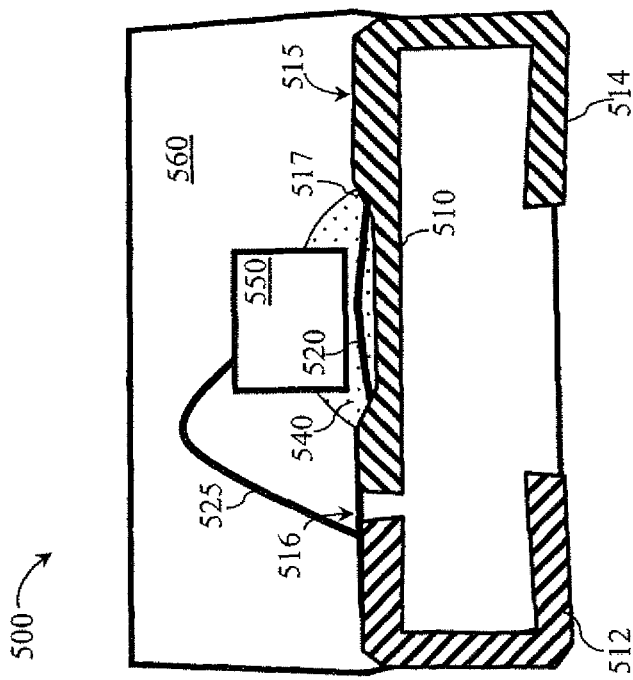
FIG. 5A illustrates a cross-sectional view of a semiconductor device having an interlocking bond wire within a groove.

FIG. 5A illustrates a cross-sectional view of a semiconductor device 500. The semiconductor device 500 may comprise a plurality of leads 512, 514, a die attach pad 510 formed by a portion of the lead 514, a semiconductor die 550, an interlock bonding structure 520, a wire bond 525 and an encapsulant body 560. The semiconductor die 550 may be disposed on a major surface 515 of the die attach pad 510. The major surface 515 of the die attach pad 510 may form a portion of the die attach surface 516. The die attach surface 516 may be a surface of the semiconductor device 500 configured to receive the semiconductor die 550. The plurality of leads 512, 514 may be a portion of a lead frame (not shown). FIG. 5B illustrates a top view of the semiconductor device 500 shown in FIG. SA without the encapsulant body 560 to illustrate inner portions of the semiconductor dev ice 500 which may be otherwise covered by the encapsulant body 560.

The semiconductor device 500 may be substantially similar to the semiconductor device 200, but may differ at least in that the die attach pad 510 of the semiconductor device 500 may comprise a groove 517 for receiving the interlock bonding structure 520. The interlock bonding structure 520 may be disposed within the groove 517. As shown in FIG. 5A and FIG. 5B, the interlock bonding structure 520 may be completely surrounded by or completely submerged within the adhesive material 540. Specifically, the interlock bonding structure 520 shown in the embodiment in FIG. 5A and FIG. 5B may be an interlocking wire bond 520 having first and second ends submerged within the adhesive material 540. Optionally, the first and second ends of the interlocking wire bond 520 may be disposed within the groove 517. The arrangement within the groove 517 may reduce packaging height.

In another embodiment, the interlocking wire bond 520 may be disposed at least partially within the groove 517. For example, one end of the interlocking wire bond 520 may be attached on a surface within the groove 517 whereas another end of the interlocking wire bond 520 may be disposed outside the groove 517. However, both ends of the interlocking wire bond 520 may be submerged within the adhesive material 540. This arrangement may have high reliability performance compared to the embodiment shown in FIG. 5A for semiconductor devices 500 with smaller semiconductor dies 550. For semiconductor devices 500 with larger semiconductor dies 550, the arrangement shown in the embodiment in FIG. SA may be have more superior reliability performance.

Figure 6B:
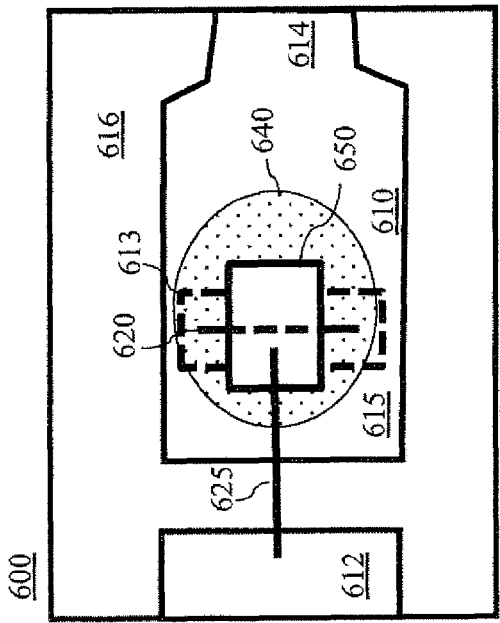
FIG. 6B illustrates a top view of the semiconductor device shown in FIG. 6A.
Figure 6C:
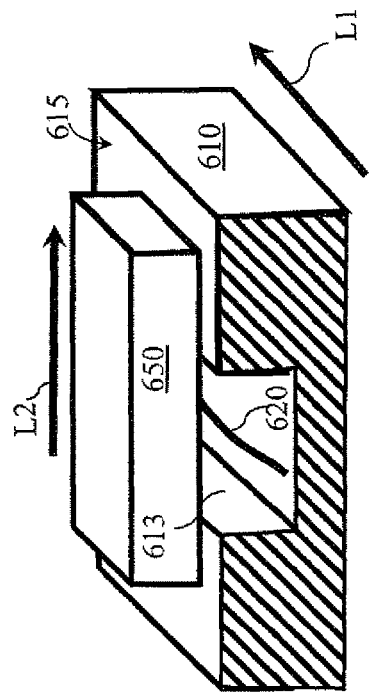
FIG. 6C illustrates a perspective cut-away view of the die attach pad and the semiconductor die of the semiconductor device shown in FIG. 6A.
Figure 6A:
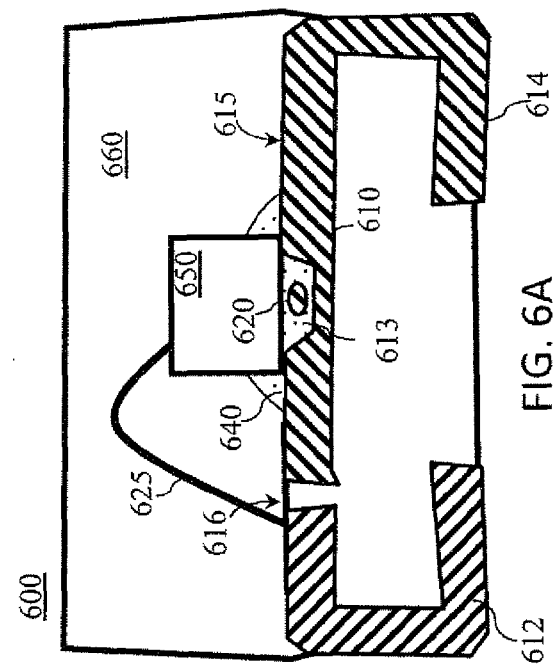
FIG. 6A illustrates a cross-sectional view of a semiconductor device having an interlocking bond wire within a trench.

FIG. 6A illustrates a cross-sectional view of a semiconductor device 600. The semiconductor device 600 may comprise a plurality of leads 612, 614, a die attach surface 616, a die attach pad 610 formed by a portion of the lead 614, a semiconductor die 650, an interlock bonding structure 620, a wire bond 625 and an encapsulant body 660. The semiconductor die 650 may be disposed on a major surface 615 of the die attach pad 610. The major surface 615 of the die attach pad 610 may form a portion of the die attach surface 616. The die attach surface 616 may be a surface of the semiconductor device 600 configured to receive the semiconductor die 650. The plurality of leads 612, 614 may be a portion of a lead frame (not shown). FIG. 6B illustrates a top view of the semiconductor device 600 shown in FIG. 6A without the encapsulant body 660 to illustrate inner portions of the semiconductor device 600 which may be otherwise covered by the encapsulant body 660.

The semiconductor device 600 may be substantially similar to the semiconductor device 500 but may differ at least in that the die attach pad 610 of the semiconductor device 600 may comprise a trench 613 for receiving the interlock bonding structure 620. The interlock bonding structure 620 may be disposed within the trench 613. As shown in FIG. 6A and FIG. 6B, the interlock bonding structure 620 may be completely surrounded by or completely submerged within the adhesive material 640. Specifically, the interlock bonding structure 620 shown in the embodiment in FIG. 6A and FIG. 6B may be an interlocking wire bond 620 having first and second ends submerged within the adhesive material 640. Optionally, the first and second ends of the interlocking wire bond 620 may be disposed within the trench 613. The arrangement with in the trench 613 may reduce packaging height.

FIG. 6C illustrates a perspective cut-away view of the die attach pad 610 and the semiconductor die 650 of the semiconductor device 600 shown in FIG. 6A. The trench 613 may extend longitudinally below the die attach surface 616 as well as the major surface 615 of the die attach pad 610. The semiconductor die 650 may be disposed on the die attach surface 616 such that the semiconductor die 650 may extend over and across the trench 613 on the die attach surface 615. As shown in FIG. 6C, the trench 613 may extend longitudinally along a first direction, which may be designated as longitudinal direction (L1). The semiconductor die 650 may extend laterally along a second direction, which may be designated as longitudinal direction (L2), and which may be substantially orthogonal to the first longitudinal direction (L1).

Figure 7:
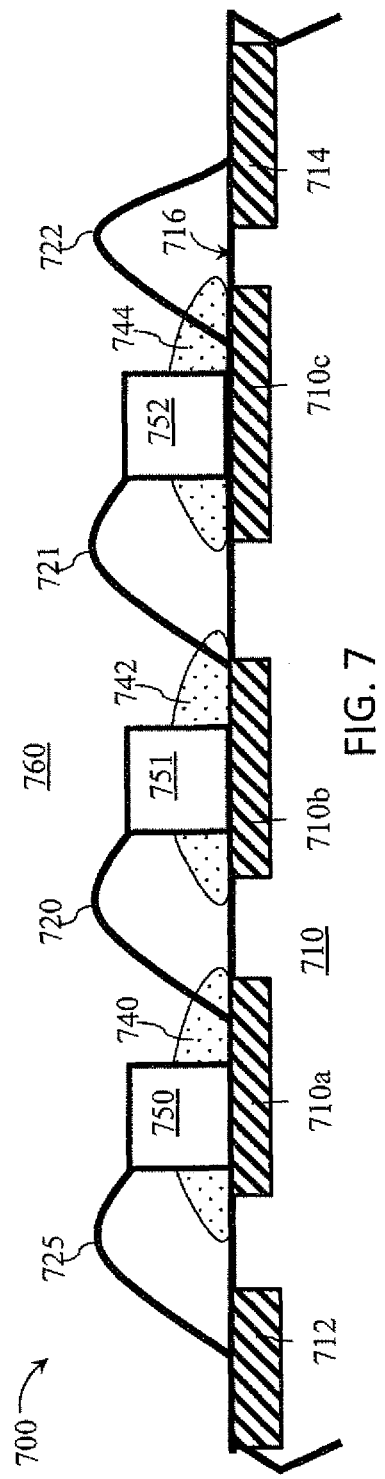
FIG. 7 illustrates a cross-sectional view of a device having a plurality of semiconductor dies.

FIG. 7 illustrates a cross-sectional view of a device 700. The device 700 may comprise a plurality of leads 712, 714, a die attach surface 716, a plurality of die attach pads 710*a*-710*c*, a plurality of semiconductor dies 750-752, a wire bond 725, a plurality of interlocking wire bonds 720-722, and an encapsulant body 760. The plurality of semiconductor dies 750-752 may be disposed on the plurality of die attach pads 710*a*-710*c* respectively on the die attach surface 716 as shown in FIG. 7. The die attach surface 716 may be a surface of the semiconductor device 700 configured to receive the semiconductor dies 750-752.

The plurality of semiconductor dies 750-752 may comprise a first semiconductor die 750, as well as first and second additional semiconductor dies 751, 752. The plurality of interlocking wire bonds 720-722 may comprise a first interlocking wire bond 720, a second interlocking wire bond 721 and a third interlocking wire bond 722. The plurality of die attach pads 710*a*-710*c* may comprise a first die attach pad 710*a*, a second die attach pad 710*b* and a third die attach pad 710*c*. The wire bond 725 may be configured to electrically couple the first semiconductor die 750 to a lead 712. The first interlocking wire bond 720 may have a first end attached on the first die attach pad 710*a* and a second end attached on the first additional semiconductor die 751. Similarly, the second interlocking wire bond 721 may have a first end attached on the second die attach pad 710*b* and a second end attached on the second additional semiconductor die 751. The third interlocking wire bond 722 may have a first end attached on the third die attach pad 710*c* and the lead 714.

The first, second and third interlocking wire bonds 720-722 may be differentiated from the wire bond 725 in that the first, second and third interlocking wire bonds 720-722 may have one end attached on one of the plurality of die attach pads 710*a*-710*c* so as to establish a mechanical interlock with the adhesive material 740. The arrangement shown in FIG. 7 illustrates the interlocking wire bonds 720-722 may be utilized as electrical connections to the plurality of semiconductor dies 750-752. The semiconductor dies 750-752 may be electrically connected in series but in another embodiment, the semiconductor dies 750-752 may be electrically connected in parallel. The lead 714 may comprise an additional wire bond pad configured to receive the interlocking wire bond 722. The lead 714 and the die attach pad 710*c* may be electrically connected.

Figure 8A:
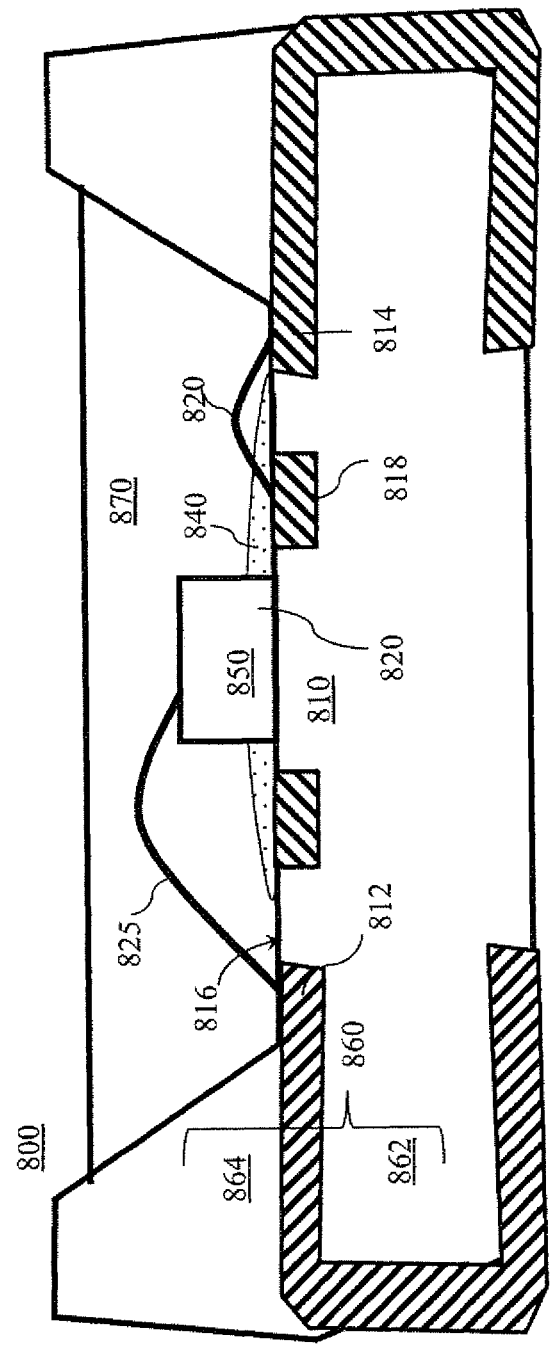
FIG. 8A illustrates a light-emitting device.

FIG. 8A illustrates a light-emitting device 800. The light-emitting device 800 may comprise a die attach pad 810, an emitter 850 attached on the die attach pad 810, a first conductive lead 812, a second conductive lead 818, a third conductive lead 814, a wire bond 825, a die attach glue 840, an interlocking wire bond 820 and encapsulant body 860. The first 812, second 818 and third 814 conductive leads may be disposed adjacent to the die attach pad 810. Unlike previously presented embodiments, the die attach pad 810 shown in FIG. 8A may comprise substantially insulation material. The die attach pad 810 may be a portion of the encapsulant body 860 surrounded by the second lead 818. As shown in FIG. 8A, the wire bond 825 may electrically couple the emitter 850 to the first conductive lead 812. The die attach glue 840 may cover a portion of the die attach pad 810 and the emitter 850 so as to adjoin the emitter 850 and the die attach pad 810. A portion of the die attach glue 840 may extend over, and may be in direct contact with, a portion of the second conductive lead 818.

The interlocking wire bond 820 may have a first end attached to the second conductive lead 818, and a second end attached to the third conductive lead 814. The third conductive lead 814 may comprise a wire bond pad configured to receive the second end of the interlocking wire bond 820. The first end of the interlocking wire bond 820 and a portion of the wire bond may be encapsulated within the die attach glue 840. The second conductive lead 818 may comprise substantially circular conductive leads surrounding the die attach pad 810.

The encapsulant body 860 may comprise a substantially reflective material. The encapsulant body 860 may comprise a lower portion 862 and an upper portion 864. A surface of the lower portion 862 may define the die attach surface 815 configured to receive the emitter 850 and the substantially transparent encapsulant 870. The substantially transparent encapsulant 870 may encapsulate the wire bond 825, the emitter 850, the die attach glue 840 and at least a portion of the die attach pad 810 and the interlocking wire bond 820.

The interlocking wire bond 820 may be configured to provide a mechanical interlock with the die attach glue 840, so as to mechanically adjoin the second conductive lead 818 and the die attach glue 840. Thus, the mechanical interlock between the interlocking wire bond 820 may indirectly improve mechanical interlock between the second conductive lead 818 and the die attach glue 840. The lower portion 862 of the encapsulant body 860 may surround the second conductive lead 818. Similarly, the mechanical interlock between the interlocking wire bond 820 and the die attach glue 840 may indirectly improve mechanical interlock between the die attach pad 810 and the die attach glue 840.

Figure 8B:
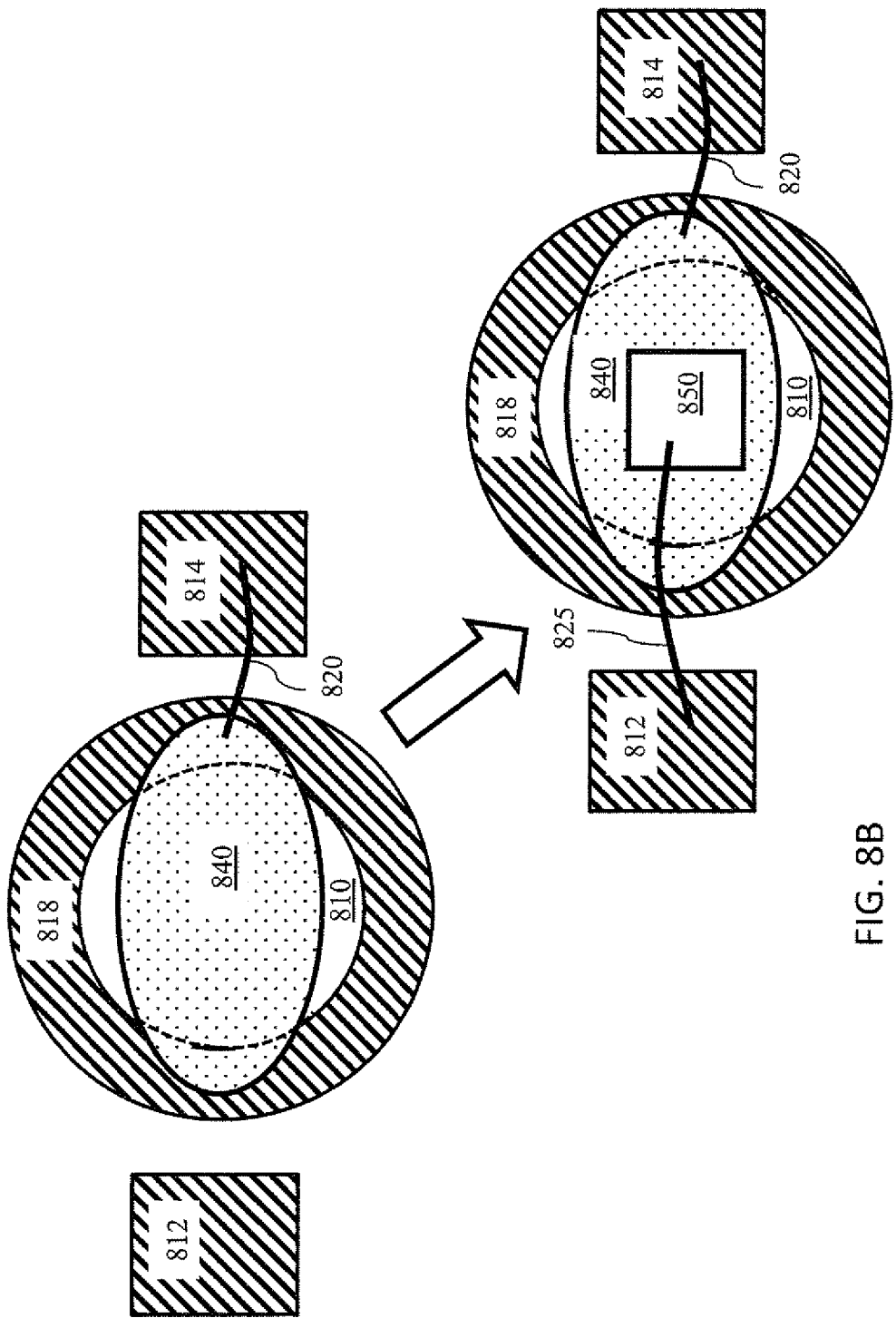
FIG. 8B illustrates a manufacturing process step of the light-emitting device shown in FIG. 8A.

FIG. 8B illustrates a manufacturing process step of the light-emitting device 800 shown in FIG. 8A. As shown in FIG. 8B, the interlocking wire bond 820 may be formed first, electrically coupling and/or connecting the second lead 818 and the third lead 814. Next, the die attach glue 840 may be applied on the die attach surface 816. Specifically, the die attach glue 840 may be applied on the die attach pad 810 such that the die attach glue 840 may cover substantially the die attach pad 810 and at least a portion of the second lead 818 and the first end of the interlocking wire bond 820. This may be followed by a die attach process, in which the emitter 850 is attached on the die attach pad 810 and the wire bond process in which the wire bond 825 is formed. The second lead 818 and the interlocking wire bond 820 may electrically connect the emitter 850 to an external circuit (not shown).

FIG. 9A illustrates a block diagram of a lighting system 990. The lighting system 990 may comprise a semiconductor device 900. The semiconductor device 900 may be one of the devices 100, 200, 300, 400, 500, 600, 700, 800 illustrated in previous embodiments. FIG. 9B illustrates a block diagram of an opto-electronic system 992. The opto-electronic system 992 may be a fiber optics system, an encoder, a proximity sensor, an optocoupler or any other device that may include an optical die. The semiconductor device 900 may be one of the devices 100, 200, 300, 400, 500, 600, 700, 800 illustrated in previous embodiments. In other words, the device 100, 200, 300, 400, 500, 600, 700, 800 illustrated in previous embodiment may form a portion of the lighting system 990 shown in FIG. 9A or a portion of the opto-electronic system 992 shown in FIG. 9B.

Figure 10A:
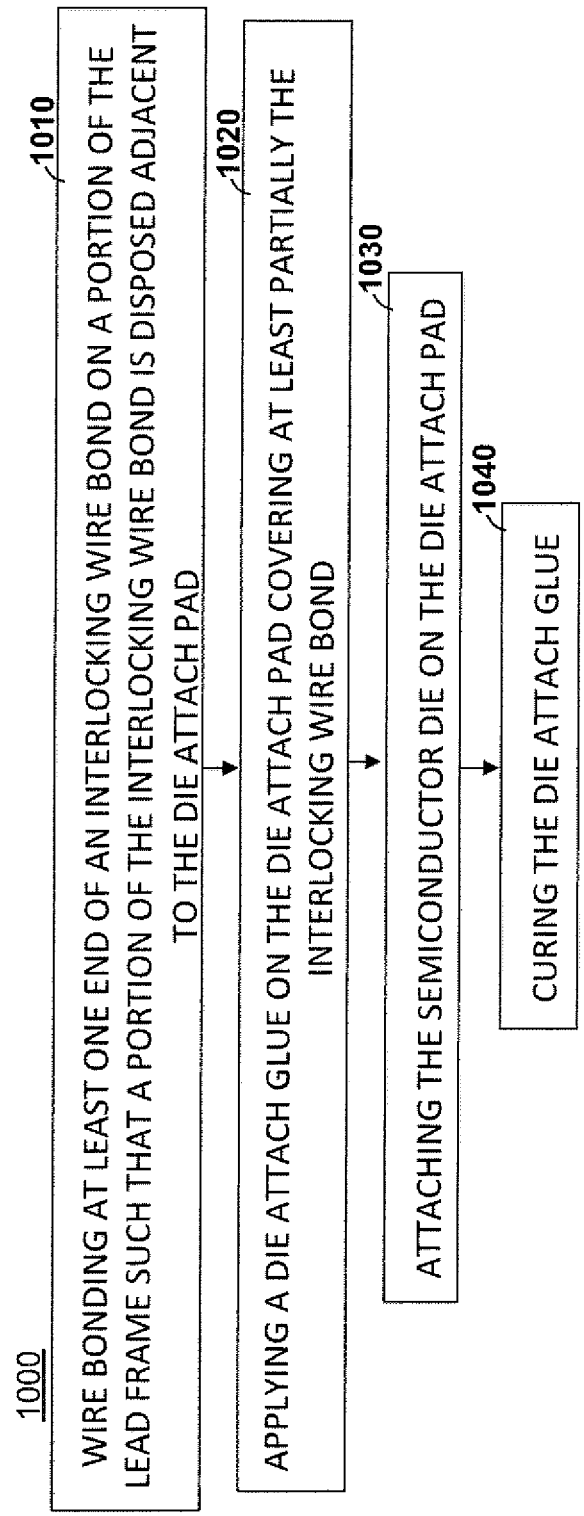
FIG. 10A illustrates a method for providing a mechanical interlock between a die attach pad of a lead frame and a semiconductor die.

FIG. 10A illustrates a method for providing a mechanical interlock between a die attach pad of a lead frame and a semiconductor die. FIGS. 10B-D illustrate various alternative steps for the method shown in FIG. 10A. Referring to FIG. 10A and FIGS. 10B-10D, the method starts with step 1010 in which at least one end of an interlocking wire bond may be wire bonded on a portion of the lead frame such that a portion of the interlocking wire bond is disposed adjacent to the die attach pad. Next, in step 1020 a die attach glue may be applied on the die attach pad covering at least partially the interlocking wire bond. The interlocking wire bond may have first and second ends. Optionally, the method may comprise step 1022 in which the first and second ends of the interlocking wire bond may be attached on the die attach pad.

Then, in step 1030 the semiconductor die may be attached on the die attach pad. In an optional step 1032, the first and second ends of the interlocking wire bond may be surrounded with the die attach glue. Alternatively, the method may comprise step 1034 a portion of the interlocking wire bond between the first and second ends of the interlocking wire bond may be surrounded with the die attach glue such that the first and second ends of the interlocking wire are exposed outside the die attach glue. In step 1040, the die attach glue may be cured into solid form.

Different aspects, embodiments or implementations may, but need not, yield one or more of the following advantages. For example, the shape, size various dimensions and various arrangement of the elements illustrated in the previously presented embodiments may be advantageous for increasing the strength of mechanical interlock between the die attach pad and the die attach glue or the adhesive material. In addition, various features illustrated in the specification may be desirable for preventing failure due to delamination of epoxy that may result in failure of the devices. For example, the interlock bonding structures illustrated throughout the specification may improve reliability performance of many semiconductor devices, including but not limited to opto-electronic devices.

Although specific embodiments of the invention have been described and illustrated herein above, the invention should not be limited to any specific forms or arrangements of parts so described and illustrated. Features illustrated in various embodiments may be combined in any manner as may seem fit to a person with ordinary skill in the art. The scope of the invention is to be defined by the claims appended hereto and their equivalents.

What is claimed is:

1. A semiconductor device, comprising:
   a die attach pad;
   a major surface comprising at least a surface of the die attach pad;
   a semiconductor die mounted on the major surface;
   an interlocking wire bond disposed on the major surface, the interlocking wire bond having a first end, a second end and a center portion interposed between the first end and the second end; and
   an adhesive material configured to adjoin the semiconductor die and the die attach pad, wherein the adhesive material covers at least partially the center portion of the interlocking wire bond.

2. The semiconductor device of claim 1, wherein the first end and the second end of the interlocking wire bond are distanced away from the adhesive material.

3. The semiconductor device of claim 1, wherein the first end and the second end of the interlocking wire bond are submerged within the adhesive material.

4. The semiconductor device of claim 1, wherein the interlocking wire bond is distanced away from the semiconductor die.

5. The semiconductor device of claim 1, wherein the first end and the second end of the interlocking wire bond are attached on the die attach pad.

6. The semiconductor device of claim 1, wherein the semiconductor device further comprising an additional interlocking wire bond having a first end and a second end, wherein the first end of the interlocking wire bond and the first end of the additional interlocking wire bond are attached on the die attach pad side-by-side.

7. The semiconductor device of claim 1, wherein the semiconductor device further comprising an additional interlocking wire bond, and wherein the interlocking wire bond and the additional interlocking wire bond are arranged interposing the semiconductor die on the major surface of the die attach pad.

8. The semiconductor device of claim 1, wherein the semiconductor die and the die attach pad are arranged interposing the center portion of the interlocking wire bond.

9. The semiconductor device of claim 8, wherein a portion of the semiconductor die engages the center portion of the interlocking wire bond.

10. The semiconductor device of claim 1, wherein the semiconductor device further comprises an additional wire bond pad adjacent to the die attach pad, and wherein the first end of the interlocking wire bond is attached on the die attach pad and the second end of the interlocking wire bond is attached on the additional wire bond pad.

11. The semiconductor device of claim 1, wherein the semiconductor die has a height measuring from the major surface, and wherein the interlocking wire bond is disposed approximately below half of the height measuring from the major surface.

12. The semiconductor device of claim 1 forms a portion of a lighting system.

13. The semiconductor device of claim 1 forms a portion of an opto-electronic system.

14. A device, comprising:
   a die attach surface;
   a die attach pad disposed within the die attach surface;
   an interlock bonding structure formed on the die attach pad;
   a semiconductor die configured to be mounted on the die attach surface; and
   a die attach glue configured to adjoin the semiconductor die and the die attach pad,
   wherein the die attach glue is configured to cover the interlock bonding structure such that the interlock bonding structure is surrounded within the die attach glue.

15. The device of claim 14, wherein the die attach pad further comprises a groove and the interlock bonding structure is disposed at least partially within the groove.

16. The device of claim 15, wherein the interlock bonding structure comprises a wire bond having a first end, and wherein the first end of the wire bond is attached on a surface within the groove.

17. The device of claim 16, wherein the wire bond has second end disposed outside the groove.

18. The device of claim 14, wherein the die attach pad further comprise a trench extending below the die attach surface, and wherein the semiconductor die extends over and across the trench on the die attach surface, and wherein the interlock bonding structure is disposed within the trench.

19. A light-emitting device, comprising:
   a die attach pad;
   an emitter mounted on the die attach pad;
   a first conductive lead disposed adjacent to the die attach pad;
   a second conductive lead disposed adjacent to the die attach pad;
   a wire bond electrically coupled the emitter to the first conductive lead;
   a die attach glue in contact with a portion of the die attach pad and the emitter so as to adjoin the emitter and the die attach pad;
   an interlocking wire bond having a first end attached to the second conductive lead, wherein at least a portion of the wire bond is surrounded by the die attach glue; and
   a substantially transparent encapsulant encapsulating the wire bond, the emitter, the die attach glue and at least a portion of the die attach pad and the interlocking wire bond,
   wherein the interlocking wire bond is configured to provide a mechanical interlock with the die attach glue so as to mechanically adjoin the second conductive lead and the die attach glue.

20. The light-emitting device of claim 19, wherein a portion of the die attach glue extends over and in direct contact with the second conductive lead.

* * * * *